US012795824B1

(12) United States Patent
Amla et al.

(10) Patent No.: US 12,795,824 B1
(45) Date of Patent: Nov. 10, 2026

(54) NEGATIVE OR NEAR ZERO PLANAR COEFFICIENT OF THERMAL EXPANSION DIELECTRICS

(71) Applicant: ADVANCED CHIP AND CIRCUIT MATERIALS, INC., San Jose, CA (US)

(72) Inventors: Tarun Amla, San Jose, CA (US); Keshav Amla, San Jose, CA (US); Jyoti Amla, San Jose, CA (US)

(73) Assignee: ADVANCED CHIP AND CIRCUIT MATERIALS, INC., San Jose, CA (US)

( * ) Notice: Subject to any disclaimer, the term of this patent is extended or adjusted under 35 U.S.C. 154(b) by 0 days.

(21) Appl. No.: 19/255,233

(22) Filed: Jun. 30, 2025

(51) Int. Cl.

| | |
|---|---|
| ***B32B 5/02*** | (2006.01) |
| ***B32B 5/26*** | (2006.01) |
| ***B32B 5/28*** | (2006.01) |
| ***B32B 15/08*** | (2006.01) |
| ***B32B 15/14*** | (2006.01) |
| ***B32B 27/02*** | (2006.01) |
| ***B32B 27/04*** | (2006.01) |
| ***B32B 27/18*** | (2006.01) |
| ***H05K 1/02*** | (2006.01) |
| ***H05K 1/03*** | (2006.01) |
| *B32B 15/20* | (2006.01) |
| *B32B 27/20* | (2006.01) |
| *B32B 27/26* | (2006.01) |
| *B32B 27/28* | (2006.01) |
| *B32B 27/30* | (2006.01) |
| *B32B 27/34* | (2006.01) |
| *B32B 27/38* | (2006.01) |
| *B32B 27/40* | (2006.01) |

(52) U.S. Cl.

CPC ........... *H05K 1/0366* (2013.01); *B32B 5/024* (2013.01); *B32B 5/26* (2013.01); *B32B 5/262* (2021.05); *B32B 5/263* (2021.05); *B32B 5/28* (2013.01); *B32B 27/02* (2013.01); *B32B 27/04* (2013.01); *H05K 1/0271* (2013.01); *H05K 1/0353* (2013.01); *H05K 1/0373* (2013.01); *B32B 15/08* (2013.01); *B32B 15/14* (2013.01); *B32B 15/20* (2013.01); *B32B 27/18* (2013.01); *B32B 27/20* (2013.01); *B32B 27/26* (2013.01); *B32B 27/28* (2013.01); *B32B 27/285* (2013.01); *B32B 27/302* (2013.01); *B32B 27/34* (2013.01); *B32B 27/38* (2013.01); *B32B 27/40* (2013.01); *B32B 2260/021* (2013.01); *B32B 2260/023* (2013.01); *B32B 2260/046* (2013.01); *B32B 2262/0269* (2013.01); *B32B 2264/1021* (2020.08); *B32B 2305/076* (2013.01); *B32B 2305/188* (2013.01); *B32B 2307/204* (2013.01); *B32B 2307/30* (2013.01); *B32B 2307/3065* (2013.01); *B32B 2307/54* (2013.01); *B32B 2307/718* (2013.01); *B32B 2398/10* (2013.01); *B32B 2457/08* (2013.01); *H05K 2201/0203* (2013.01); *H05K 2201/0209* (2013.01); *H05K 2201/0278* (2013.01); *H05K 2201/029* (2013.01); *Y10T 442/2475* (2015.04); *Y10T 442/2631* (2015.04); *Y10T 442/2738* (2015.04); *Y10T 442/2902* (2015.04); *Y10T 442/3415* (2015.04); *Y10T 442/3423* (2015.04); *Y10T 442/3431* (2015.04); *Y10T 442/3455* (2015.04); *Y10T 442/3472* (2015.04); *Y10T 442/3569* (2015.04); *Y10T 442/3577* (2015.04); *Y10T 442/3585* (2015.04)

(58) Field of Classification Search
None
See application file for complete search history.

(56) References Cited

U.S. PATENT DOCUMENTS

| | | | | | |
|---|---|---|---|---|---|
| 4,255,752 | A * | 3/1981 | Noble | H01Q 21/005 | 343/872 |
| 4,513,055 | A * | 4/1985 | Leibowitz | H05K 1/0366 | 442/212 |
| 4,687,681 | A * | 8/1987 | Siemon | C08J 5/248 | 427/538 |
| 4,814,945 | A * | 3/1989 | Leibowitz | H05K 1/0366 | 361/792 |
| 4,851,613 | A * | 7/1989 | Jacques | H05K 1/028 | 174/254 |
| 4,875,282 | A * | 10/1989 | Leibowitz | H05K 3/4626 | 29/830 |
| 4,876,120 | A * | 10/1989 | Belke | H05K 1/0346 | 428/209 |

(Continued)

FOREIGN PATENT DOCUMENTS

| | | | | |
|---|---|---|---|---|
| CN | 104943297 | A * | 9/2015 | C08J 5/249 |
| CN | 106584995 | A * | 4/2017 | B32B 15/20 |

(Continued)

OTHER PUBLICATIONS

Ibrahim, Abstract of Thermoplastic-based composites with low CTE for space structures and circuit board applications, 1986, International SAMPE Symposium and Exhibition (Year: 1986).*

(Continued)

*Primary Examiner* — Jeffrey A Vonch
(74) *Attorney, Agent, or Firm* — Lando & Anastasi, LLP

(57) ABSTRACT

Composite dielectric materials including woven aramid fabrics impregnated with thermoset and thermoplastic resins are disclosed. The composite dielectric materials may have a near zero or negative coefficient of thermal expansion (CTE) in the planar directions. The materials would act as thermo-mechanical stabilizers and also provide utility as embedded components.

20 Claims, No Drawings

(56) References Cited

U.S. PATENT DOCUMENTS

| | | | | | |
|---|---|---|---|---|---|
| 4,963,425 | A * | 10/1990 | Buchanan | B32B 27/34 | 428/209 |
| 5,436,301 | A * | 7/1995 | Nishimura | H05K 1/0366 | 525/523 |
| 2010/0254098 | A1* | 10/2010 | Tsukada | H05K 1/115 | 174/262 |
| 2010/0259910 | A1* | 10/2010 | Hayashi | H01L 23/145 | 361/783 |
| 2011/0232953 | A1* | 9/2011 | Oga | H05K 3/4602 | 174/258 |
| 2012/0090883 | A1* | 4/2012 | Bchir | H05K 1/0366 | 29/829 |
| 2013/0256018 | A1* | 10/2013 | Hayashi | H05K 1/0306 | 174/258 |
| 2015/0305154 | A1* | 10/2015 | Hayashi | H05K 1/0298 | 428/688 |
| 2016/0060429 | A1* | 3/2016 | Kitai | C08L 63/00 | 523/451 |
| 2016/0168378 | A1* | 6/2016 | Umehara | H05K 1/0353 | 524/508 |
| 2018/0312683 | A1* | 11/2018 | Umehara | C08F 222/10 | |
| 2020/0181402 | A1* | 6/2020 | Liu | C08J 5/244 | |
| 2023/0062178 | A1* | 3/2023 | Hsieh | B32B 5/02 | |
| 2024/0247120 | A1* | 7/2024 | Tonouchi | H05K 1/0366 | |

FOREIGN PATENT DOCUMENTS

| | | | | | |
|---|---|---|---|---|---|
| CN | 114231030 | A | * | 3/2022 | B32B 5/02 |
| FR | 2717298 | A1 | * | 9/1995 | H01F 6/06 |
| JP | S61204229 | A | * | 9/1986 | |
| JP | S61204230 | A | * | 9/1986 | |
| JP | S6335630 | A | * | 2/1988 | |
| JP | S63102927 | A | * | 5/1988 | |
| JP | S63150327 | A | * | 6/1988 | |
| JP | S63278938 | A | * | 11/1988 | |
| JP | S63291442 | A | * | 11/1988 | |
| JP | S63311746 | A | * | 12/1988 | |
| JP | H01320147 | A | * | 2/1989 | |
| JP | S6479236 | A | * | 3/1989 | |
| JP | H01124648 | A | * | 5/1989 | |
| JP | H01141925 | A | * | 6/1989 | |
| JP | H01257388 | A | * | 10/1989 | |
| JP | H026539 | A | * | 1/1990 | |
| JP | H0274327 | A | * | 3/1990 | |
| JP | H0284438 | A | * | 3/1990 | |
| JP | H02194588 | A | * | 8/1990 | |
| JP | H0390671 | A | * | 4/1991 | |
| JP | H0393837 | A | * | 4/1991 | |
| JP | H0582971 | A | * | 4/1993 | |
| JP | H05104675 | A | * | 4/1993 | |
| JP | H05254048 | A | * | 10/1993 | |
| JP | H0634449 | A | * | 2/1994 | |
| JP | H06218828 | A | * | 8/1994 | |
| JP | H06244515 | A | * | 9/1994 | |
| JP | H07216112 | A | * | 8/1995 | |
| JP | H07290623 | A | * | 11/1995 | |
| JP | H09124801 | A | * | 5/1997 | |
| JP | H09296374 | A | * | 11/1997 | |
| JP | H11222798 | A | * | 8/1999 | |
| JP | H11261241 | A | * | 9/1999 | |
| JP | 2000091470 | A | * | 3/2000 | |
| JP | 2000269617 | A | * | 9/2000 | |
| JP | 2001129889 | A | * | 5/2001 | |
| JP | 2001244588 | A | * | 9/2001 | |
| JP | 2001302879 | A | * | 10/2001 | |
| JP | 2006203142 | A | * | 8/2006 | |
| JP | 2007115840 | A | * | 5/2007 | |
| JP | 2008306092 | A | * | 12/2008 | |
| JP | 2009185170 | A | * | 8/2009 | |
| JP | 2009231431 | A | * | 10/2009 | |
| JP | 2011162615 | A | * | 8/2011 | |
| JP | 2012041662 | A | * | 3/2012 | |
| JP | 2013053303 | A | * | 3/2013 | C08J 5/249 |
| JP | 2013185278 | A | * | 9/2013 | |
| JP | 2020143263 | A | * | 9/2020 | |
| KR | 20130112183 | A | * | 10/2013 | B32B 37/02 |
| WO | WO-2013021587 | A1 | * | 2/2013 | C08J 5/249 |
| WO | WO-2013076972 | A1 | * | 5/2013 | H05K 1/0373 |
| WO | WO-2013088659 | A1 | * | 6/2013 | B32B 7/027 |
| WO | WO-2016031205 | A1 | * | 3/2016 | B32B 27/26 |
| WO | WO-2017051510 | A1 | * | 3/2017 | B32B 15/20 |

OTHER PUBLICATIONS

Ibrahim, Surface Mount Technology (SMT) Substrate Material Requirements â A Brief Review, Sep. 1987, vol. 108, pp. 159=168 (Year: 1987).*

Johnson et al., Thermal Expansion Properties of Composite Materials, Jul. 1989, Lockheed Missiles & Space Co. Inc., NASA Report (Year: 1989).*

Hirakawa et al., A new aramid/epoxy laminate for advanced SMT, Sep. 1990, IEEE Transactions on Components, Hybrids, and Manufacturing Technology, vol. 13, No. 3, pp. 570-575 (Year: 1990).*

Wetherhold et al., Controlling thermal deformation by using laminated plates, 1996, Composites Part B: Engineering, vol. 27, No. 1, pp. 51-57 (Year: 1996).*

Machine Translation of JP2006203142A, Aug. 2006 (Year: 2006).*

Machine Translation of JP2013053303A, Mar. 2013 (Year: 2013).*

Technology Marketing Inc., ARAMID (KevlarÂ®) FABRIC, Sep. 2022 (Year: 2022).*

* cited by examiner

NEGATIVE OR NEAR ZERO PLANAR COEFFICIENT OF THERMAL EXPANSION DIELECTRICS

FIELD OF TECHNOLOGY

Embodiments relate generally to the use of woven aramid fabric with thermoset or thermoplastic resins to make composite dielectric materials having near zero or negative coefficients of thermal expansion (CTE) in the planar directions. These composite dielectric materials serve multiple purposes, providing thermomechanical stability and integrated capacitive functions to enhance electrical performance in addition to other benefits.

BACKGROUND

In semiconductor packaging and printed circuit board (PCB) technologies, managing thermomechanical stress is of paramount importance. Differential CTE between dissimilar materials—such as silicon chips, underfills, solder joints, printed circuit boards and organic substrates—can lead to warpage, delamination, solder fatigue, and other reliability failures during thermal cycling. These effects are particularly pronounced in advanced packaging schemes such as flip-chip, chip-on-film, and embedded die technologies, where miniaturization exacerbates CTE mismatch-induced strains. Conventional materials such as woven glass fabrics in epoxy/Bismaleimide/PPE and other matrices typically exhibit positive in-plane CTE values ranging from 12 to 30 ppm/° C. This mismatch with copper (CTE~17 ppm/° C.) and silicon (CTE~2.5 ppm/° C.) can lead to mechanical reliability issues such as warpage, reduced solder joint reliability and field failures for devices. Over the past several decades, numerous approaches have been developed to achieve lower CTE in composite systems. These have basically involved using glass reinforcements that are low CTE such as T-Glass or Quartz. The gains in CTE reduction have not been significant. The effect on the overall CTEs of the board is therefore not significant.

Reducing the CTE of substrates including copper clad laminates and prepreg materials is a recognized strategy to mitigate mismatch strain and improve warpage control. A PCB, generally, is a composite comprising of various materials including copper, glass, and resin, and comprising of various polymers, additives, and fillers; the planar CTEs are dominated primarily by copper as it has the highest modulus (~110 GPa) amongst all constituents. The strategy to counteract this by using lower CTE prepregs and laminates is not of much value as the copper still dominates and a 20-30% reduction in the CTE of laminates and prepregs is not enough to bring about a meaningful change in the planar CTEs of the board. Therefore, materials that have CTEs which are significantly lower than copper and materials which also have a high enough modulus are needed to reduce the overall CTE of the board. In essence, planar CTE should be close to zero or negative to effectively reduce the CTE of the overall board.

A woven composite material exhibiting negative or near-zero CTE offers the potential for high in-plane dimensional stability, particularly beneficial in multilayer PCB cores, package substrates, and thermal interface materials.

However, the use of woven composite architecture specifically engineered to exhibit negative CTE has not yielded great results. The potential for using conductive reinforcements such as carbon has been explored but it is a nonstarter when the composite is expected to behave as a dielectric. Carbon is conductive and therefore, by definition, not fit to be used as a Dielectric.

While there is a significant demand for low CTE materials, the challenge is also to make these so that the materials have good electrical properties and also demonstrate that these systems are suitable for making materials for Printed circuit boards where electrical properties are important. The material should not be conductive and should be able to bond with other materials such as copper and other Dielectrics.

Kevlar (aramid) fibers are known for their high tensile strength, low density, and relatively low thermal expansion in the fiber direction. However, woven Kevlar composites have historically exhibited close to double digits CTEs (PPM/C).

Unexpectedly, the inventors have discovered that certain woven aramid fiber composites, when processed with polymer systems exhibit negative in-plane CTEs. This behavior is not predicted by rule-of-mixtures models or existing micromechanical theories and provides a novel pathway for engineering dimensionally stable composite substrates for use in a variety of applications ranging from Printed circuit boards, as cores for substrates and aerospace applications.

The present invention addresses this unmet need by proposing a novel woven composite engineered to exhibit tailored negative CTE properties in one or more principal directions, thereby improving dimensional stability and reliability in thermally stressed electronic assemblies.

SUMMARY

The present invention provides a composite dielectric material comprising a woven aramid fabric, such as Kevlar 49, or Kevlar 29 embedded in a polymer matrix. The composite exhibits a negative in-plane coefficient of thermal expansion (CTE) over a temperature range of interest, such as 20° C. to 260° C.

The resulting composite exhibits an in-plane CTE ranging from −1 ppm/° C. to as low as −11 ppm/° C. This behavior is unexpected based on current understanding of woven composite mechanics.

In one embodiment, the woven reinforcement is a plain or satin weave Aramid/Kevlar fabric, and the polymer matrix may be a thermoset matrix system comprising of, but not limited to, one or more of Bismaleimide (BMI), Poly Phenylene Ether (PPE), High Tg epoxy, phenolics or Cyanate esters.

In another embodiment, the woven reinforcement is a plain or satin weave Kevlar fabric, and the polymer matrix may be a thermoplastic matrix system such as but not limited to Poly ether imide, Poly Ether Ether Ketone, Poly Phenylene Sulphide.

In another embodiment the composite dielectric material is partially cured and in B-stage or prepreg form.

In one of the embodiments the composite dielectric material is fully cured after pressing one or more plies under heat and pressure and in C-stage or laminate form.

In one of the embodiments the composite dielectric material is fully cured after pressing with copper on one or both sides with one or more plies under heat and pressure and in C-stage or copper clad laminate form.

DETAILED DESCRIPTION

In an exemplary embodiment, the composite comprises:

A woven Kevlar 49 fabric with an area (basis) weight of approximately 20-250 gsm.

A thermosetting polymer matrix comprising of, but not limited to, one or more of PPE, BMI, cyanate ester, High Tg Epoxy or phenolic resin.

A resin content of approximately 30-80% by volume.

B-Stage (Prepreg) or Laminate including copper clad construction involving 1 or more plies of the Dielectric composite In another embodiment the polymer matrix comprises of Bismaleimide or functionalized Poly Phenylene ether, a flame retardant and filler.

In another embodiment the Polymer matrix contains fillers such as Silica, Talc, boron nitride.

In a preferred embodiment the Polymer matrix has greater than 25% inorganic filler by weight.

In another embodiment, the Polymer matrix has greater than 5% inorganic filler by weight.

In some embodiments, the Polymer matrix may not contain any fillers.

In accordance with one or more embodiments, a woven para aramid fiber fabric based Composite Dielectric material is disclosed that exhibits low to negative CTE.

In some embodiments, the Composite Dielectric material is laminated under heat and pressure with copper to form a copper clad laminate In another embodiment the composite is a B-staged material that can be used as prepreg or bond sheet for a multilayer circuit board In another embodiment the composite dielectric material may have thickness <50 Microns In another embodiment the composite dielectric material may have thickness <20 Microns In another embodiment the composite dielectric material may have a thickness >200 microns.

In some embodiments, the woven aramid fiber fabric may be impregnated with a crosslinked thermosetting polymer resin. The crosslinked thermosetting polymer resin may comprise an epoxy resin, a bismaleimide resin, a cyanate ester resin, a BT resin, a polybutadiene resin, or a PPE/PPO resin. The crosslinked thermosetting polymer resin may comprise at least one resin selected from the group consisting of: a vinyl functional PPE resin, an OPE resin, a Bismaleimide resin, a Triallyl Cyanurate resin and a Tri Allyl Isocyanurate resin.

In some embodiments, the crosslinked thermosetting polymer resin may be substantially halogen free. The crosslinked thermosetting polymer resin may further include at least one of: a flame retardant, a curing agent, a hardener, a filler, and/or an additive.

The composite dielectric material may be copper clad on one or both sides.

In some embodiments, the Composite Dielectric material may be characterized by a glass transition temperature (Tg) of greater than about 150° C.

In some embodiments the woven aramid fiber fabric may be impregnated/coated with a thermoplastic resin.

In some embodiments, the Composite Dielectric material may be characterized by a glass transition temperature (Tg) of greater than about 200° C.

In some embodiments, the Composite Dielectric material may be characterized by a glass transition temperature (Tg) of greater than about 250° C.

In some embodiments, the Composite Dielectric material is characterized by a dielectric constant (DK) of less than about 4.0.

In some embodiments, the Composite Dielectric material may be characterized by a dielectric constant (DK) of less than about 3.7.

In some embodiments, the Composite Dielectric material may be characterized by a tensile modulus in the planar directions of greater than 20 GPa In some embodiments, the Composite Dielectric material may be characterized by a tensile modulus in the planar directions of greater than 40 GPa In some embodiments, the coefficient of thermal expansion (CTE) of the Composite Dielectric material may be less than about 2 PPM/° C. in either of the planar directions over a temperature range of about 20° C. to about 260° C.

In some embodiments, the coefficient of thermal expansion (CTE) of the Composite Dielectric material may be less than about 0 PPM/° C. in either of the planar directions over a temperature range of about 20° C. to about 260° C.

In some embodiments, the coefficient of thermal expansion (CTE) of the Composite Dielectric material may be less than about-2 PPM/° C. in either of the planar directions over a temperature range of about 20° C. to about 260° C.

In some embodiments, the coefficient of thermal expansion (CTE) of the Composite Dielectric material may be less than about-4 PPM/° C. in either of the planar directions over a temperature range of about 20° C. to about 260° C.

In some embodiments, the coefficient of thermal expansion (CTE) of the Composite Dielectric material may be less than about-6 PPM/° C. in either of the planar directions over a temperature range of about 20° C. to about 260° C.

In some embodiments, the coefficient of thermal expansion (CTE) of the Composite Dielectric material may be less than about-8 PPM/° C. in either of the planar directions over a temperature range of about 20° C. to about 260° C.

In some embodiments, the coefficient of thermal expansion (CTE) of the Composite Dielectric material may be less than about-10 PPM/° C. in either of the planar directions over a temperature range of about 20° C. to about 260° C.

In some embodiments the coefficient of thermal expansion (CTE) of the Composite Dielectric material may be less than 0 PPM/° C. in either of the planar directions over a temperature range of about −40° C. to about 260° C.

In some embodiments, the Composite Dielectric material may be used as a copper clad laminate for capacitive layers and plane layers in a Printed Circuit board.

In some embodiments, the Composite Dielectric material may be used as a prepreg or a bonding sheet in a Printed Circuit board.

In accordance with one or more embodiments, the composite dielectric material may be used in a high speed board, high frequency board or chip packaging substrate, High Density interconnect including any printed circuit board as described as a laminate, copper clad laminate or prepreg.

In accordance with one or more embodiments, various woven aramid fiber fabric reinforcements may be used. In some embodiments, the reinforcement may be Kevlar 29 or equivalent such as available from DuPont and woven by any suitable weaver in a plain weave.

In some embodiments, the basis weight of the fabric is less than or equal to 220 GSM.

In some embodiments, the basis weight of the fabric is less than or equal to 180 GSM.

In some embodiments the basis weight of the fabric is less than or equal to 58 GSM.

In some embodiments the basis weight of the fabric is less than or equal to 34 GSM.

In accordance with one or more embodiments, the composite dielectric material may be characterized by a low dissipation factor. In some embodiments, the dissipation factor of the composite dielectric material is less than about 0.008.

In some embodiments, the dissipation factor of the composite dielectric material is less than about 0.005.

In accordance with one or more embodiments, the resin used for impregnating the woven aramid fiber fabric may be a crosslinked thermosetting polymer composition. A wide range of possible resin systems can be used, including but not limited to epoxies, bismaleimides, cyanate esters, BT, polybutadiene, and PPE/PPO. In some embodiments, the polymer system may include at least one resin selected from the group consisting of: a vinyl functional PPE resin, an OPE resin, a Bismaleimide resin, a Triallyl Cyanurate resin and a Tri Allyl Isocyanurate resin.

In some embodiments, the resin system may include one or more hardeners, such as TAIC/TAC, polybutadienes, styrene butadienes, maleic anhydrides and/or amines.

In some embodiments, the resin system may include flame retardants, such as phosphinates, Phosphazene and/or DOPO.

In some embodiments, the resin system may include various fillers and additives, such as Silica, Talc and/or glass microspheres.

In at least some embodiments, the resin system may be substantially halogen free.

In some embodiments the composite dielectric material can be made using combinations of materials such as vinyl functional PPE available from Sabic corporation such as SA9000, or OPE resins from Mitsubishi chemicals, Bismaleimide resins such as BMI 5100, BMI 2300 available from Daiwa Kasei of Japan or GMI 5100 from Shin A Tec of South Korea, Triallyl Cyanurate or Tri Allyl Isocyanurate available from Evonik corporations. Fillers such as Fused Silica, Talc or air-filled microspheres may be used.

In preferred embodiments of the resin, combinations of functionalized PPE and of Triallyl Cyanurate/Triallyl Isocyanurate and/or butadiene styrene polymers such as Ricon 100, Ricon 257 and Polymers of butadiene such as Ricon 134, Ricon 154, Ricon 156, and Ricon 157 available from Total with flame retardants and fillers and a peroxide curing agent are used. In preferred embodiments, the curing agent is a peroxide agent. Examples of peroxide curing agents include dicumyl peroxide, Benzoyl peroxide, lauroyl peroxide, 2-Butanone peroxide, and mixtures comprising one or more of the peroxide curing agents. In preferred embodiments, the curing agent is present in an amount of about 0.25 wt. % to about 6 wt. %, based on the total weight of the resin. In some embodiments, Spherical Silica, Talc, Hexagonal Boron Nitride, glass filled microspheres are used. Flame retardant such as Exolit® OP935 or Exolit® OP945 Aluminum Poly Phosphinate available from Clariant corporation, SPB100 or Phosphazene available from Otsuka chemical corporation can also be used as a flame retardant for halogen free embodiments. In some embodiments phosphorated compounds such as Altexia from Albemarle or PQ 60 from Chin Yee chemicals may also be used, alone or in combination with other flame retardants.

In halogenated embodiments, flame retardants such as Saytex 8010, Ethylene-1,2-bis (pentabromophenyl) or BT 93 from Albemarle corporation can be used.

In optional embodiments, epoxy resins cured with SMA type hardeners may be used with combination of Cyanate esters with accelerators such 2-MI, 2,4 EMI.

In some embodiments, the resin system may have a density range from 1.0 g/cc to 2.3 g/cc.

In some embodiments, the viscosity of the resin can range from about 50 centipoise to greater than about 1500 centipoise, depending on the solvent and filler loadings.

In accordance with one or more embodiments, the resin used for impregnation may be characterized by low loss and low DK so as to impart a low dissipation factor and dielectric constant. For example, resins including PPE as well as Styrene Butadiene type systems may be used. In some embodiments the neat resin DK is less than about 3.5. In preferred embodiments, the DK of the neat resin is less than about 3.0. In some embodiments, the DK of the neat resin may be less than about 2.5. The dissipation factor (DF) of the neat resin may be less than about 0.010 in some embodiments. In preferred embodiments, the DF of the resin may be less than about 0.005. In some embodiments, the DF of the resin may be less than about 0.0025.

In at least some nonlimiting embodiments, a pressure of greater than about 50 psi and temperature greater than about 100° C., preferably in excess of 150° C., may be applied to provide full cure and crosslinking of the resin system, to form C-staged material or laminate(s).

In some embodiments, provided herein are methods of manufacturing a sheet of Composite Dielectric material. In a preferred embodiment, the woven Aramid fabrics are fully impregnated in a dip pan and then sent through squeeze rolls or through slot dies to achieve the thickness requirements. The viscosity of the varnish can range from about 50 cPs to about 1500 cPs depending on the filler content and desired thickness.

The process of manufacture generally includes the use of horizontal or vertical treaters. The horizontal ovens are typically float-on-air/air floatation, while the vertical ovens are usually infrared or convection with air impingement. For better thickness control, slot die, doctor blade, gravure, or other techniques are used. The temperature for treating can be between 100° C. to 300° C. with about 120° C. to about 175° C. preferred. The oven temperature range is typically over 150° C. at the hottest sections. The temperature profile and speed may be adjusted in accordance with the boiling range of the solvents.

In some embodiments, the composite dielectric material may be clad, e.g. copper clad.

In some embodiments, the woven aramid fiber fabric reinforced composite dielectric material can be laminated onto copper foil to facilitate easy application for printed circuit board fabrication. In optional embodiments the woven aramid fiber fabric is supported by a release or carrier film such as PET. In at least some embodiments, the web may be substantially unsupported.

Printed circuit boards are of many types ranging from single sided to double sided to multilayer boards. A single lamination multilayer printed circuit board (PCB) is built by layering multiple sheets of copper-clad fiberglass or other insulating substrate material together, with each layer containing a different pattern of conductive traces and vias that interconnect the components and circuits on the board.

In another embodiment, the composite dielectric material may incorporate a hybrid reinforcement layer combining woven aramid fabric with a fiber scrim to enhance modulus and further reduce CTE.

In a further embodiment, a multi-material layup is utilized, alternating Aramid/Kevlar-based woven layers with ceramic or mica-filled prepregs to optimize both in-plane and through-thickness dimensional stability.

Other embodiments may vary the resin system by including high-temperature thermosets such as bismaleimides or polyimides to extend the operating temperature range above 200° C.

The fabric weave may also be modified from plain to twill or 5-harness satin to alter the impact on CTE and mechanical performance.

In accordance with one or more embodiments, a method of making a Composite dielectric material is disclosed. The method may involve providing a woven aramid fiber fabric reinforcement, impregnating the reinforcement with a thermosetting polymer resin, drying the impregnated reinforcement and pressing the dried impregnated reinforcement to form a composite dielectric material.

In some embodiments, the viscosity of the resin may be between about 50 cPs and about 1500 cPs.

In some embodiments, drying may be performed in a horizontal oven at a temperature of from about 80° C. to about 200° C.

In some embodiments, drying may be performed in a Vertical oven at a temperature of from about 100° C. to about 300° C.

In some embodiments, the method may further involve controlling a thickness of the impregnated reinforcement prior to drying with a squeeze roll, slot die, doctor blade or gravure. The method may further involve copper cladding the composite dielectric material. The method may further involve supporting the composite dielectric material with a foil, release, or carrier film.

In some embodiments the thickness control is carried out by a pair of rods one above and below the fabric to enable impregnation in a horizontal oven.

The disclosure contemplates all combinations of any one or more of the foregoing embodiments and/or embodiments, as well as combinations with any one or more of the embodiments set forth in the detailed description and any examples.

In another embodiment the Composite Dielectric materials may be particularly suitable for use in printed circuit boards and packages that reduce warpage, stress and increase reliability.

One of the key challenges in impregnating Aramid fabrics such as Kevlar 29 and Kevlar 49 is that encapsulation is the key. If the thermoset resin does not totally encapsulate the fabric, it can lead to delamination and massive voiding. In one of the embodiment the encapsulation issues is addressed by carrying out more than one pass on the fabric to make sure that it is fully impregnated and there are no voids especially when the weave is sparse.

The present invention relates to laminates and prepregs that include a woven aramid fabric, plain weave or other suitable weaves as reinforcement for use as a single or multiple layers in a printed circuit board.

In accordance with one or more non-limiting embodiments, a prepreg may refer to a b-staged, or partially cured, Composite dielectric material comprising a fabric that has been impregnated with a resin and dried.

In accordance with one or more non-limiting embodiments, a laminate may refer to a c-staged, or substantially fully cured, Composite Dielectric material or stack of multiple Composite Dielectric material layers that may or may not be clad with copper or another conductive material. A laminate may generally be formed from one or multiple prepregs by application of pressure and temperature.

In accordance with one or more non-limiting embodiments, a "Composite Dielectric material", "dielectric material", "composite", or "dielectric" may refer to a b-staged or c-staged dielectric material that comprises a single ply that has or multiple plies that have been impregnated with a resin.

In accordance with one or more non-limiting embodiments, a "polymer matrix", "resin", or "resin system" may refer to a reacted/a-staged resin, varnish, or slurry, including additives, fillers, and/or flame retardants, either on its own or in reference to it as part of a composite dielectric material.

The function and advantages of these and other embodiments can be better understood from the following calculations and examples. These examples are intended to be illustrative in nature and are not considered to be limiting the scope of the invention.

Unexpected Results

For a resin-based fiber-reinforced composite, the Coefficient of Thermal Expansion according to Micromechanics (Rule of Mixtures) is given by:

$$\frac{E_f V_f \alpha_f + E_R V_R \alpha_R}{E_f V_f + E_R V_R},$$

Where $E_f$ is the Modulus of the fiber, $V_f$ is the Volume Fraction of the fiber, $\alpha_f$ is the Coefficient of Thermal Expansion of the fiber, $E_R$ is the Modulus of the resin, $V_R$ is the Volume Fraction of the resin, and $\alpha_R$ is the Coefficient of Thermal Expansion of the Resin. Crimp factor and efficiency factors come into play but those will only increase the CTE not reduce it.

The values for the directional volume fraction are a function of the thread count in each direction. The directional volume fraction in each direction is given by number of threads in a given direction divided by the sum of threads in both directions.

The below calculations show a low CTE Resin with high filler loading, very high Tg, and high modulus with Kevlar 29 and 49, T-glass and carbon Fiber.

| Type | Basis wt GSM | Modulus GPa | CTE PPM/C. | Resin Content Percentage | Thickness Microns | CTE-X Predicted PPM/C. 20-260 C. | CTE-Y Predicted PPM/C. 20-260 C. | CTE-X Measured PPM/C. 20-260 C. | CTE-Y Measured PPM/C. 20-260 C. |
|---|---|---|---|---|---|---|---|---|---|
| Kevlar 29 | 58 | 70.5 | −3.96 | 40% | 68 | 3.2 | 5.6 | −8.1 | −7.7 |
| Kevlar 29 | 58 | 70.5 | −3.96 | 51% | 83 | 5.1 | 7.7 | −6.1 | −5.5 |
| Kevlar 29 | 58 | 70.5 | −3.96 | 71% | 142 | 10.6 | 13.4 | −3.1 | −3.3 |
| Kevlar 29 | 34 | 70.5 | −3.96 | 50% | 48 | 4.9 | 7.5 | −4.2 | −4.0 |
| Kevlar 49 | 180 | 112.4 | −4.86 | 42% | 218 | 0.4 | 2.0 | −9.2 | −9.7 |
| T-Glass | 103 | 86 | 2.8 | 44% | 129 | 9.0 | 9.2 | 12.3 | 12.5 |
| Carbon T-300 | 193 | 234 | −0.63 | 50% | 272 | 2.7 | 2.7 | 3.5 | 3.7 |

The above table shows that there is a significant gap between predicted and actual values. The properties of thermosetting resin are a CTE of 35 PPM/° C., a Tg>260° C., and a modulus of 8 GPa. This is a low CTE resin system, as typical resin systems have CTEs ranging from 50 to 70 PPM/° C. Similar results are expected with other resins.

Only with Aramid woven fabrics is a strong unexpected synergy is observed. The results are totally unexpected.

The observed negative expansion is hypothesized to result from constrained micro buckling, resin-fiber shrinkage coupling, or stress-induced contraction, though the mechanism remains under investigation.

Example 1

Various resin formulations were prepared and a number of woven fiber fabric reinforcements of different thickness were treated/impregnated with the formulations and pressed. The pressed laminates were tested for a number of properties including thickness, Tg, Expansion and Peels.

An example of the polymer formulation is noted below:

| Formulation A | |
|---|---|
| BMI 5100 | 12 |
| PPE SA9000 | 4 |
| TAIC | 5 |
| OP945 | 7 |
| Styrene Butadiene Polymer | 21 |
| Dicup | 1 |
| Spherical Silica | 50 |
| MEK | 70 |

BMI was dissolved in MEK after heating to 50° C., Styrene Butadiene Polymer and TAIC were added next, followed by the flame retardants. Dicup was added next, followed by Silica. The resin was used to impregnate woven Aramid, Kevlar 29 and Kevlar 49, T-Glass and Carbon fabric and the impregnated fabric was dried at 150° C. for 4 minutes in a Class A oven. The material was pressed at 225° C. for 2 hours.

The summary of the properties is given below.

| Type | Basis wt GSM | Modulus GPa | CTE PPM/C. | Resin Content Percentage | Thickness Microns | CTE-X Predicted PPM/C. 20-260 C. | CTE-Y Predicted PPM/C. 20-260 C. | Tg Deg C. | Modulus in Plane GPa Average X + Y RT(30 C.) - Unclad | Peels lb/inch one Ounce |
|---|---|---|---|---|---|---|---|---|---|---|
| Kevlar 29 | 58 | 70.5 | −3.96 | 43% | 72 | −8.1 | −7.6 | >300 | 43.9 | 4.1 |
| Kevlar 29 | 58 | 70.5 | −3.96 | 51% | 83 | −6.1 | −5.5 | >300 | 40.0 | 4.3 |
| Kevlar 29 | 58 | 70.5 | −3.96 | 71% | 137 | −3.1 | −3.3 | >300 | 33.0 | 5.0 |
| Kevlar 29 | 34 | 70.5 | −3.96 | 50% | 48 | −4.2 | −4.0 | >300 | 37.4 | 4.5 |
| Kevlar 49 | 180 | 112.4 | −4.86 | 42% | 218 | −9.2 | −9.7 | >300 | 56.1 | 4.3 |
| T-Glass | 103 | 86 | 2.8 | 44% | 129 | 12.3 | 12.5 | >300 | 29.9 | 5.3 |
| Carbon T-300 | 193 | 234 | −0.63 | 50% | 272 | 3.5 | 3.7 | >300 | 68.7 | 3.5 |

Example 2

Example polymer formulation using different filler loadings is shown below:

| Formulation B Different Filler Percent | | | |
|---|---|---|---|
| | 1 | 2 | 3 |
| BMI 5100 | 5 | 5 | 5 |
| PPE SA9000 | 11 | 11 | 11 |
| TAIC | 4 | 4 | 4 |
| OP945 | 10 | 10 | 10 |
| Styrene Butadiene Polymer | 19 | 19 | 19 |
| Dicup | 1 | 1 | 1 |
| Spherical Silica | 50 | 17 | 0 |
| MEK | 67 | 45 | 34 |
| Filler % | 50% | 25% | 0% |

The formulations were run with different filler loadings. The resin was used to impregnate Kevlar 29, 58 GSM to evaluate the impact on CTE, the fabric was dried at 150° C. for 4 minutes in a Class A oven. The material was pressed at 225° C. for 2 hours.

The summary of the properties is given below.

Various properties as a function of filler content are given below:

| Type | Basis wt GSM | Modulus GPa | CTE PPM/C. | Resin Content Percentage | Thickness Microns | CTE-X PPM/C. | CTE-Y PPM/C. | Tg Deg C. | Modulus in Plane GPa Average X + Y RT (30 C.)- Unclad | Filler % |
|---|---|---|---|---|---|---|---|---|---|---|
| Kevlar 29 | 58 | 70.5 | −3.96 | 50% | 71.55325 | −6.2 | −5.4 | 252 | 42.9 | 50% |
| Kevlar 29 | 58 | 70.5 | −3.96 | 51% | 81.73596 | −5.2 | −4.4 | 251 | 40.4 | 25% |
| Kevlar 29 | 58 | 70.5 | −3.96 | 48% | 137.0135 | −5.4 | −5.0 | 255 | 33.4 | 0% |

The example above shows that the filler percentage is not a significant factor affecting the CTEs, which is an unexpected result.

Prophetic Example

Currently thinner fabrics below 34 Gsm are not available, in future we expect fabrics as low as 10 gsm to be available enabling negative CTE products down to 15 microns composite dielectric material thickness for use in Chip packaging and other PCB applications including Ultra HDI. The "Extrapolated" CTE values shown in this table for this prophetic example are extrapolated from the results of the present invention (and not based on the traditional predictions).

| Type | Basis wt GSM | Modulus GPa | CTE PPM/C. | Resin Content Percentage | Thickness Microns | CTE-X Extrapolated PPM/C. 20-260 C. | CTE-Y Extrapolated PPM/C. 20-260 C. |
|---|---|---|---|---|---|---|---|
| Kevlar 29 | 10 | 70.5 | −3.96 | 51% | 14 | −6.1 | −5.3 |
| Kevlar 49 | 10 | 112.4 | −4.86 | 50% | 14 | −7.1 | −6.6 |

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several embodiments of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure and are intended to be within the scope of the invention. Accordingly, the foregoing description and drawings are by way of example only.

Those skilled in the art should appreciate that the parameters and configurations described herein are exemplary and that actual parameters and/or configurations will depend on the specific application in which the disclosed methods and materials are used. Those skilled in the art should also recognize or be able to ascertain, using no more than routine experimentation, equivalents to the specific embodiments disclosed.

What is claimed is:

1. A composite dielectric material usable as a core, a bonding layer, or a prepreg for a printed circuit board or for a copper clad laminate or as a substrate in a high speed board, in a high frequency board, in a high density interconnect, or in a chip package, the composite dielectric material comprising:

a woven aramid fiber fabric; and a thermosetting polymer matrix impregnating the woven aramid fiber fabric, wherein the composite dielectric material has an in-plane tensile modulus of at least about 20 GPa, and wherein the composite dielectric material exhibits a negative in-plane coefficient of thermal expansion (CTE) over a temperature range of at least from about 20° C. to 260° C. of less than about-3.0 ppm/° C., such that the CTE is at least about 4.0 ppm/° C. lower than a predicted CTE value according to the equation:

$$\frac{E_f V_f \alpha_f + E_R V_R \alpha_R}{E_f V_f + E_R V_R}$$

wherein $E_f$ is the tensile modulus of the aramid fiber, $V_f$ is the volume fraction of the aramid fiber, $\alpha_f$ and is the CTE of the aramid fiber, $E_R$ is the tensile modulus of the resin, $V_R$ is the volume of the resin, $\alpha_R$ and is the CTE of the resin.

2. The composite dielectric material of claim 1, wherein the woven aramid fiber fabric comprises an x-axis along a first fiber direction and a y-axis along a second fiber direction, and the in-plane CTE and the tensile modulus are provided along each of the x-axis and the y-axis.

3. The composite dielectric material of claim 1, wherein the aramid fiber comprises Kevlar 49 or Kevlar 29.

4. The composite dielectric material of claim 3, wherein the woven aramid fiber fabric has a basis weight of less than 250 grams per square meter.

5. The composite dielectric material of claim 1, wherein the aramid woven fiber fabric is a plain weave or a satin weave.

6. The composite dielectric material of claim 1, wherein the polymer matrix comprises epoxy, cyanate ester, or phenolic resin.

7. The composite dielectric matrix of claim 1, wherein the thermosetting polymer matrix comprises bismaleimide (BMI) and/or polyphenylene ether (PPE) and triallyl cyanurate/isocyanurate (TAC/TAIC) and/or styrene butadiene copolymer.

8. The composite dielectric material of claim 1 which is substantially halogen free.

9. The composite dielectric material of claim 1 which has a Tg>150° C.

10. The composite dielectric material of claim 1 which has a Tg>200° C.

11. The composite dielectric material of claim 1 which has a Tg>250° C.

12. The composite dielectric material of claim 1, wherein the in-plane tensile modulus is at least about 30 GPa.

13. The composite dielectric material of claim 12, wherein the in-plane tensile modulus is at least about 40 GPa.

14. The composite dielectric material of claim 1, wherein the composite is a laminate structure comprising one or more woven plies in a symmetrical layup.

15. A copper clad laminate comprising the composite dielectric material of claim 1 as the bonding sheet or prepreg clad with copper.

16. A printed circuit board (PCB) comprising one or more layers of the composite dielectric material of claim 1.

17. A composite dielectric material usable as a core, a bonding layer, or a prepreg for a printed circuit board or a copper clad laminate or as a substrate in a high speed board, in a high frequency board, or in a chip package, comprising:

a woven aramid fiber fabric; and a thermosetting polymer matrix impregnating the woven aramid fiber fabric, wherein the thermosetting polymer matrix comprises a mixture of bismaleimide (BMI), polyphenylene ether (PPE), styrene butadiene copolymer and/or triallyl cyanurate/isocyanurate, peroxide curing agent, and optionally one or more fillers, wherein the composite dielectric material comprises a Tg of greater than about 250° C., wherein the composite dielectric material has an in-plane tensile modulus of at least about 20 GPa, and wherein the composite dielectric material exhibits a negative in-plane coefficient of thermal expansion (CTE) over a temperature range from about 20° C. to 260° C. of less than about −3.0 ppm/° C.

18. The composite dielectric material of claim 17, wherein the negative in-plane CTE over the temperature range from about 20° C. to 260° C. is greater than about −11.0 ppm/° C.

19. The composite dielectric material of claim 17, wherein the woven aramid fiber fabric comprises an x-axis along a first fiber direction and a y-axis along a second fiber direction, and the in-plane CTE and the tensile modulus are provided along each of the x-axis and the y-axis.

20. The composite dielectric material of claim 17, wherein the thermosetting polymer matrix further comprises flame retardant and contains the one or more fillers, wherein the one or more fillers comprise spherical silica.

* * * * *